(12) United States Patent
Powell et al.

(10) Patent No.: US 9,247,340 B2
(45) Date of Patent: Jan. 26, 2016

(54) CIRCUITS FOR IMPROVED AUDIO SIGNAL RECONSTRUCTION

(71) Applicant: REVx Technologies, Inc., Austin, TX (US)

(72) Inventors: Wayne J. Powell, Centennial, CO (US); Dennis Rauschmayer, Plano, TX (US)

(73) Assignee: REVx Technologies, Inc., Austin, TX (US)

( * ) Notice: Subject to any disclaimer, the term of this patent is extended or adjusted under 35 U.S.C. 154(b) by 0 days.

(21) Appl. No.: 14/503,687

(22) Filed: Oct. 1, 2014

(65) Prior Publication Data

US 2015/0016634 A1    Jan. 15, 2015

Related U.S. Application Data

(63) Continuation-in-part of application No. 14/279,111, filed on May 15, 2014, now Pat. No. 9,008,324.

(60) Provisional application No. 61/823,737, filed on May 15, 2013.

(51) Int. Cl.
| | |
|---|---|
| *H04R 29/00* | (2006.01) |
| *H03H 11/00* | (2006.01) |
| *H04R 3/00* | (2006.01) |
| *H02B 1/00* | (2006.01) |
| *H04R 1/26* | (2006.01) |
| *H03H 7/38* | (2006.01) |

(Continued)

(52) U.S. Cl.
CPC . *H04R 1/26* (2013.01); *H03H 7/20* (2013.01); *H03H 7/38* (2013.01); *H04R 3/00* (2013.01); *H03H 7/1783* (2013.01); *H03H 2001/005* (2013.01); *H04R 2400/00* (2013.01)

(58) Field of Classification Search
CPC ............ H04R 1/22; H04R 1/227; H04R 3/04; H04R 1/26; H04R 2400/00; H04R 3/00; H03H 7/38; H03H 7/20; H03H 7/1783; H03H 2001/005
USPC ................................ 381/59, 58, 55, 111, 123
See application file for complete search history.

(56) References Cited

U.S. PATENT DOCUMENTS

| | | | |
|---|---|---|---|
| 1,832,452 | A | 11/1931 | Feldtkeller et al. |
| 2,624,781 | A | 1/1953 | Bowman |

(Continued)

FOREIGN PATENT DOCUMENTS

| | | |
|---|---|---|
| EP | 2670052 | 12/2013 |
| KR | 10-2006-094728 | 8/2006 |

OTHER PUBLICATIONS

"Your Solution to Education Training System—Chapter 6—PCM Demodulator", Gott, www.gott.com.my, obtained Apr. 2014.

*Primary Examiner* — Xu Mei
*Assistant Examiner* — Douglas Suthers
(74) *Attorney, Agent, or Firm* — Fish & Tsang LLP

(57) ABSTRACT

An impedance matched resonant circuit uses inductors coupling an audio source and a speaker array in order to reduce feedback reflection induced by an audio signal traveling from the audio source to the array of speakers. An RC circuit could also be coupled to the positive and negative terminals of the speaker array to reduce the slope differential of the audio signal at certain frequencies. The circuit can be packaged together in a single module with switches to activate and deactivate portions of the circuit to alter the effectiveness of the circuit depending upon need.

13 Claims, 5 Drawing Sheets

(51) Int. Cl.
*H03H 7/20* (2006.01)
*H03H 1/00* (2006.01)
*H03H 7/01* (2006.01)

(56) References Cited

U.S. PATENT DOCUMENTS

| | | | |
|---|---|---|---|
| 4,006,315 A | | 2/1977 | Halstead |
| 4,597,100 A | * | 6/1986 | Grodinsky et al. ............ 381/99 |
| 5,937,072 A | | 8/1999 | Combest |
| 6,115,475 A | | 9/2000 | Alexander |
| 7,747,228 B2 | | 6/2010 | Kasha et al. |
| 8,190,109 B2 | | 5/2012 | Ali et al. |
| 8,254,601 B2 | | 8/2012 | Feldstein et al. |
| 8,472,907 B2 | | 6/2013 | Yamagajo et al. |
| 2006/0193485 A1 | * | 8/2006 | Park ............................. 381/312 |
| 2007/0189554 A1 | | 8/2007 | Innis et al. |
| 2007/0201707 A1 | | 8/2007 | Ando et al. |
| 2009/0175378 A1 | | 7/2009 | Staszewski et al. |
| 2010/0081379 A1 | | 4/2010 | Cooper et al. |
| 2011/0158433 A1 | | 6/2011 | Lee |
| 2011/0159832 A1 | | 6/2011 | Yamagajo et al. |
| 2011/0200203 A1 | | 8/2011 | Chu |
| 2013/0325149 A1 | | 12/2013 | Manssen et al. |

* cited by examiner

CIRCUITS FOR IMPROVED AUDIO SIGNAL RECONSTRUCTION

This application is a continuation-in-part of U.S. application Ser. No. 14/279,111, filed May 14, 2014, which claims the benefit of U.S. Provisional Application No. 61/823,737, filed May 15, 2013. This and all other referenced extrinsic materials are incorporated herein by reference in their entirety. Where a definition or use of a term in a reference that is incorporated by reference is inconsistent or contrary to the definition of that term provided herein, the definition of that term provided herein is deemed to be controlling.

FIELD OF THE INVENTION

The field of the invention is circuits to achieve substantially reflectionless impedance matching for use with a speaker system.

BACKGROUND

The background description includes information that may be useful in understanding the present invention. It is not an admission that any of the information provided herein is prior art or relevant to the presently claimed invention, or that any publication specifically or implicitly referenced is prior art.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

Efforts have been made in the past to match the impedance of an incoming signal to an output load. For example, U.S. Pat. No. 8,254,601 to Feldstein, issued Aug. 28, 2012, entitled "Impedance Matching Speaker Wire System" teaches a compensation circuit connected in series with a speaker system and an incoming signal. More specifically, Feldstein describes a coaxial line having a predetermined characteristic impedance wherein the circuit is configured with circuit components that allow for adjustment of the impedance of the output circuit. Moreover, in Feldstein, the range of frequencies the tuning circuit can process is limited due to its predetermined characteristic impedance resulting in inefficient filtering of some frequencies. As a consequence of the solution presented in Feldstein, the fidelity and level of definition in the music is significantly impaired.

Additional efforts have been made through the use of capacitors. U.S. Patent Publ. 2007/0189554 to Innis, published Aug. 16, 2007, entitled "Audio speaker including impedance matching circuit" teaches impedance matching through integrated circuitry. By configuring the capacitors in parallel, a user can engage a switch to selectively shunt electrical current around the capacitors. The result is altering of effective speaker impedance. By quantifying the value of the speakers, the matching circuit in Innis is limited to only matching certain predefined input values. Consequently, the efficiency of the matching circuit is generally not optimal.

Other efforts have been made to achieve reflectionless impedance matching. U.S. Pat. No. 1,832,452 to Feldtkeller et al. teaches a telephone interconnecting circuit that, by proportioning resistances to a transmission line, allows for termination that is practically free from reflection and attenuation from a transmitter to loud speakers. This solution, however, fails to take into account that audio signals—unlike transmission line signals—can contain many different frequencies, and thus using a resistor (a static component) to match impedance is suboptimal over a range of frequencies.

U.S. Pat. No. 7,747,228 to Kasha et al. similarly shows efforts made to reduce signal reflection via impedance matching. Kasha et al. teaches the use of an impedance matching component placed between an amplifier output and an antenna. The result is that signal reflections are either reduced or eliminated. This reference, however, does not provide any detail as to what type of component might be used to achieve the goal of reflectionless impedance matching.

U.S. Patent Application No. 2009/0175378 to Staszewski et al. teaches a system capable of matching impedances over a wide range of radio frequencies or other high frequency ranges. To accomplish this, it digitally transforms a first load impedance into a second load impedance. However, this reference fails to teach impedance matching using passive components.

U.S. Application No. 2013/0325149 to Manssen et al. teaches a circuit that can tune impedance to match a frequency coming into an antenna. However, this reference requires active controlling to create matched impedance and thus fails to appreciate that impedance matching can be achieved using passive components.

U.S. Pat. No. 8,190,109 to Ali et al. describes a system of active impedance matching. It measures the amount of reflected energy and then, using that value, varies the impedance of a component in the system before making another measurement and making another adjustment. In other words, Ali et al. teaches a closed-loop control system for impedance matching. In this way, it can converge on a solution resulting in substantially reflectionless matching. This system, as with Manssen et al., fails to appreciate that substantially reflectionless impedance matching can be achieved without the use of a feedback loop.

U.S. Pat. No. 8,472,907 to Yamagajo et al. teaches an antenna system that includes one or more impedance matching elements. However, devices of this reference fail to teach impedance matching over a range of frequencies.

Other related references are similarly deficient. See U.S. Patent Application No. 2010/0081379, U.S. Patent Application No. 2011/0159832A1, U.S. Pat. No. 4,006,315, U.S. Patent Application No. 2007/0201707.

Thus, there is still a need to further improve the power efficiency of a speaker circuit by providing substantially reflectionless impedance matching using passive circuit components that allow for impedance matching over a wide range of frequencies.

SUMMARY OF THE INVENTION

As used herein, an "array of speakers" has a positive terminal, a negative terminal, and has one or more speakers coupled in parallel and/or serially with those terminals. In one aspect of the inventive subject matter, a circuit is configured to reduce quantization noise present in a signal that has been reconstructed from a digitally encoded audio signal. Preferred embodiments of the circuit include two sets of circuit components, but even more preferred embodiments of the circuit include three sets of circuit components. Each set of circuit components provides improved impedance matching within the overall circuit, where the overall circuit also includes the audio signal source and the array of speakers.

To accomplish this, the circuit includes at least three inductors and a capacitor. These components are organized two sets of components, where both sets are in series with each other and also with an audio signal source and an array of speakers.

One set of components includes at least two inductors and a capacitor, and is coupled to both the positive terminal of the audio signal source and the positive terminal of the array of speakers. Another set of components includes at least one inductor and is coupled to both the negative terminal of the array of speakers and the negative terminal of the audio signal source. In some embodiments, this set of components can also include two inductors and a capacitor arranged in the same way. The first and second circuitry are coupled to the terminals as described above either directly or indirectly (e.g., wired or wirelessly, or having some other components between the described circuitry and the audio signal source and/or the array of speakers).

In the circuitry components coupled to the positive terminals, an inductor is in series with a capacitor and both are in parallel with another inductor, such that a signal traveling from an audio signal source would encounter the inductors before encountering the capacitor. With this configuration the inductors work to prevent very high frequency signals from passing to the speakers (e.g., frequencies above 20 kHz, or more preferably 25 kHz). However, some amount of very high frequency signal will nevertheless make it past the first and second inductors. Since an inductor and the capacitor are in parallel with the other inductor, the signal will be split. On the branch with the inductor and the capacitor, the signal will pass the inductor before encountering the capacitor. On the other side, the signal will pass through the second inductor to the array of speakers.

When high frequency portions of an audio signal move past the inductor on the branch of the circuit with the capacitor, the capacitor collects charge. As the same signal travels to the array of speakers along the branch of the circuit without the capacitor, the capacitor discharges into the signal. Charge from the capacitor is "injected" back into the audio signal slightly out of phase (i.e., lagging behind the signal). In this way, the capacitor helps to rebuild portions of the signal that are missing information resulting from the reconstruction of the signal from a digitally encoded audio file.

In preferred embodiments, at least one of the first, second, and third inductors used with the circuit includes a paramagnetic material within the core. In other embodiments, the inductors include at least a ferromagnetic material, while in still further embodiments the inductors include some combination of one or more paramagnetic materials or one or more ferromagnetic materials.

In another aspect of the inventive subject matter, the impedance matching qualities of the speaker are improved by the addition of a resistor and a capacitor (or their Thevenin equivalent components). In preferred embodiments, a resistor and a capacitor are in series with each other and positioned such that they are in parallel with the array of speakers. The resistor and the capacitor act as a high-pass filter (e.g., as frequency approaches infinity, the impedance of the capacitor approaches zero). Resistance and capacitance can be selected such that frequencies above a certain range are allowed to pass through the resistor and capacitor. The end result is that undesirable high frequency signals do not pass through the array of speakers, in effect improving sound quality by allowing the array of speakers to avoid reproduction of sounds that result from digital encoding and decoding.

In a preferred embodiment, the circuit described above additionally includes switches to allow for phase shifting. The switches are configured to allow an audio signal to circumvent the inductors and capacitors (i.e., switches are in parallel with these components). Additionally a switch is preferably in series with the resistor and capacitor such that, when the switch is open, no signal can pass through the resistor or capacitor.

These switches can be operated either manually or electronically. When operated electronically, a computer system can be implemented to effect precise phase shifting as needed to maximize sound production efficiency in the array of speakers. In preferred embodiments, the switches are operated individually or in tandem by a computer controlled system.

In another aspect of the inventive subject matter, both the circuitry connected to the positive terminals of the audio signal source and the array of speakers and the circuitry coupled to the negative terminals of the same include at least two inductors and a capacitor. This configuration provides the benefit of a capacitor to both the positive and negative terminals of the array of speakers. Because audio signals fluctuate about 0 volts, it is advantageous to smooth the signal travelling to both the positive and negative terminals of the array of speakers.

Preferred embodiments also include a resistor and capacitor that are in series with one another and in parallel with the array of speakers. The resistor and capacitor, as with the embodiment described above, provide filtering to allow signals above a particular frequency to pass (e.g., above 20 kHz or more preferably above 25 kHz). Because the resistor and capacitor are in parallel with the array of speakers, when signal passes through the resistor and capacitor, it does not pass through the array of speakers, thereby preventing frequencies above its cutoff range from reaching the array of speakers.

In addition, the resistor and capacitor can be tuned to provide improved impedance matching. Either the resistor or the capacitor, or both, can be varied either manually or electronically. Varying the resistance and/or capacitance of the resistor and/or capacitor can provide improved impedance matching by changing the effective impedance of an array of speakers (i.e., because the resistor and capacitor are in parallel with the array of speakers, the effective impedance of the speakers is decreased by some factor depending on the resistance and capacitance of the resistor and capacitor).

To maintain impedance matching and a desirable balance between the circuitry coupled to the positive terminals of an audio signal source and an array of speakers and the circuitry coupled to the negative terminals of an audio signal source and an array of speakers, the Thevenin equivalent impedances of those circuitries should be approximately equivalent. It is contemplated that the circuitries' resultant impedances should be within 15% of one another.

In preferred embodiments, switches can again be implemented to effect phase shifting. The switches must be positioned such that, when in the closed position, an audio signal circumvents the inductors and capacitors coupled to the positive and negative terminals of the array of speakers and the audio signal source, and such that signal cannot pass through the resistor and capacitor. The switches can be operated either manually or automatically, but preferably the switches are operated electronically such that a computer system can be implemented to open and close the switches very quickly.

In preferred embodiments, the inductors include a gap portion and a core portion. The gap portion can be comprised of air or some other material, but in preferred embodiments the gap portion includes at least one of a ferromagnetic and a diamagnetic material. By including different materials in the gap and the core, the inductors can be designed to exhibit various, desired properties (e.g., different permeability and frequency response characteristics).

The inductors coupled to the positive and/or negative terminals are preferably made at least in part with one or more magnetically responsive materials including, for example, paramagnetic materials, diamagnetic materials, and/or ferromagnetic materials. Generally the magnetically responsive material(s) would comprise the core and/or gap of the inductor(s). The core and/or gap can be formed into a cylinder or bar with wire wrapped around it, or in any other suitable arrangement. Another possible configuration includes, for example, a toroid with the coil of wire threaded through the central hole. In some embodiments, the inductor comprises a combination of materials, such as two ferromagnetic, diamagnetic, and/or paramagnetic bars separated by a ferromagnetic, diamagnetic, and/or paramagnetic material in the gap portion between the bars or a ferromagnetic, diamagnetic, and/or paramagnetic toroid having a ferromagnetic, diamagnetic, and/or paramagnetic gap.

The inductance of each inductor determines a frequency beyond which amplitude drop-off occurs for signals passing through each inductor. Taking advantage of this effect, inductors can be selected and/or designed to create signal drop-off at a desired frequency. In embodiments where a user might prefer a drop off in signal levels beyond a first frequency at one time, and a drop off in signal levels beyond a second frequency at a second time, a plurality of inductors could be provided having switches that activate preferred inductors and deactivate non-preferred inductors. Alternatively, a variable inductor could be provided that is configured to vary inductance of the inductor coupled to the positive terminal and/or the negative terminal, allowing a user to tune the circuit to produce a preferred sound quality. Switches could be provided that bypass the inductor altogether in embodiments where a user might not want the input signal to be altered by an inductor at all. A single control station could, for example, set the inductance in a first circuit to be 100 µH during the first 30 seconds of a song, raise the inductance to be 500 µH for the next 30 seconds, and then lower the inductance to 300 µH for the rest of the song. In this manner, a user could configure an audio enhancement kit to have a plurality of signal drop-off levels throughout a song from a single control station, where that song has a range of frequencies.

In embodiments where there is an inductor coupled to the negative terminal of the array of speakers, the inductor is configured to provide improved impedance matching. By matching the impedance between the negative terminal of the array of speakers and the negative terminal of the audio signal source, the array of speakers is able to perform better, because the driver of any speaker in the array of speakers would be able to more freely resonate. This effect is brought about by the inductor's tendency to absorb current generated by the electromagnetic effect of the permanent magnet of a speaker moving relative to a voice coil. Thus, coupling inductors to both the positive and negative terminals of the array of speakers provides the benefit of compensating for electromagnetic effects on both the positive and negative sides of the array of speakers. In preferred embodiments, it is advantageous for the circuitry coupled to the negative terminal of the array of speakers to have an impedance that is substantially similar to the impedance of the circuitry coupled to the positive terminal of the array of speakers.

In preferred embodiments, the different components of the circuit are variable, either mechanically or electrically. For example, the capacitors of some embodiments are varied mechanically to adjust their capacitances. Such adjustments can change the resultant Thevenin equivalent impedance of the various circuitries, allowing a user to physically adjust the capacitances to, in effect, tune the circuit's response to an audio signal. In other embodiments, the capacitance of the capacitor can be adjusted electronically (e.g., via an electrical signal from a computer or other signal generating component). In still other embodiments, at least one of the first, second, and third inductors can be variable (e.g., mechanically, electronically, or otherwise).

It should be apparent to those skilled in the art that many modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

DETAILED DESCRIPTION

Figure 1:
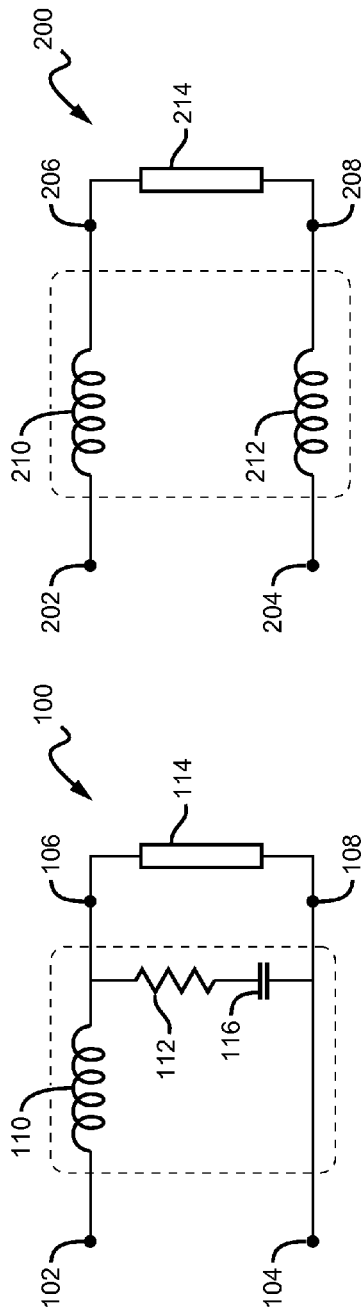
FIG. 1 shows a circuit for improving efficiency of an array of speakers that includes an inductor and a capacitor.

Various objects, features, aspects and advantages of the inventive subject matter will become more apparent from the following detailed description of preferred embodiments, along with the accompanying drawing figures in which like numerals represent like components.

The following discussion provides many example embodiments of the inventive subject matter. Although each embodiment represents a single combination of inventive elements, the inventive subject matter is considered to include all possible combinations of the disclosed elements. Thus if one embodiment comprises elements A, B, and C, and a second embodiment comprises elements B and D, then the inventive subject matter is also considered to include other remaining combinations of A, B, C, or D, even if not explicitly disclosed.

In some embodiments, the numbers expressing quantities of ingredients, properties such as concentration, reaction conditions, and so forth, used to describe and claim certain embodiments of the invention are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description of all Markush groups used in the appended claims.

As used herein, and unless the context dictates otherwise, the term "coupled to" is intended to include both direct coupling (in which two elements that are coupled to each other contact each other) and indirect coupling (in which at least one additional element is located between the two elements). Therefore, the terms "coupled to" and "coupled with" are used synonymously.

As used herein, a "capacitor" can be either a single component having a capacitance, or any combination of commonly used circuit components that have the same Thevenin equivalent capacitance. As used herein, an "inductor" can be either a single component having an inductance, or any combination of commonly used circuit components that have the same Thevenin equivalent inductance.

The inventive subject matter described herein is directed to a circuit that minimizes signal reflection by substantially matching the impedances of an audio signal source (e.g., a music player, an amplifier, etc.) and an array of speakers. As defined herein the term "array of speakers" means one or more speakers that are coupled with each other in series and/or in parallel. In addition, some embodiments of the circuit modify an audio signal to reduce quantization errors.

When a power source, such as an audio amplifier, feeds an array of speakers, the power transferred between the two is limited by the extent to which the impedances of the two are matched. Two types of impedance matching exist in electrical circuits. The first is maximum power transfer matching and the second is electrical matching. Both are described in detail below.

To obtain maximum power transfer from a source to a load, the load impedance must be matched to the source impedance. For a resistive circuit, this match is achieved by ensuring the source and load resistances are equal. For a complex circuit that includes a time dependent signals, such a match is achieved when the load impedance is the complex conjugate of the source impedance.

Maximum power transfer matching is advantageous when the goal is to get as much power as possible out of a source and neither the source nor the feed impedances can be changed. However, a system designed for maximum power transfer is not always the most efficient system and, in fact, efficiency of such a system is half that of a system matched for reflectionless signal transmission.

When an electrical signal encounters a resistance (or an impedance), a portion of that signal can be reflected back toward the source. In reflectionless matching, source and load impedances are matched such that substantially no part of an electrical signal is reflected back to the source. In the case of a circuit dealing with a non-time dependent signal, reflectionless matching is achieved by the extent to which the real component of the source and load impedances are equal. For complex circuits that handle AC signals, reflectionless matching is achieved when both the real and imaginary parts of the source and load impedances are equal. Note that reflectionless matching and maximum power transfer matching have the same result for non-time dependent signals since a signal that is not time dependent will have no complex component.

Signal reflection is undesirable in many applications, including for example, sound reproduction. Signal reflection can cause issues including amplification of some frequencies, cancellation of other frequencies, and it can affect dynamic ranges and cause distortion.

Impedance matching in the case of a DC circuit (i.e., a circuit without a complex source) can be achieved by matching a source resistance with a load resistance. As used herein, a "source resistance" is a Thevenin equivalent resistance of a signal source while a "load resistance" is a Thevenin equivalent resistance of a load. Matching these resistances results in maximum power dissipated across the load resistance. This can be explained using Ohm's law and the equation describing electronic power. Ohm's law is, $$V=IR$$

and electronic power is described as, $$P=IV$$

where V is voltage, I is current, R is resistance, and P is power.

For example, given a source having a constant resistance of 50Ω and constant voltage of 100 V, Table 1 shows how power dissipated by the load is affected when the load resistance ($R_{Load}$) is varied from 45 to 55Ω. Notably, power dissipation in the load is maximized when the source resistance is equal to the load resistance.

TABLE 1

| $V_{Load}$ | I | $R_{Load}$ | $P_{Load}$ |
|---|---|---|---|
| 47.4 | 1.05 | 45 | 49.861 |
| 47.9 | 1.04 | 46 | 49.913 |
| 48.5 | 1.03 | 47 | 49.952 |
| 49.0 | 1.02 | 48 | 49.979 |
| 49.5 | 1.01 | 49 | 49.995 |
| 50.0 | 1.00 | 50 | 50.000 |
| 50.5 | 0.99 | 51 | 49.995 |
| 51.0 | 0.98 | 52 | 49.981 |
| 51.5 | 0.97 | 53 | 49.958 |
| 51.9 | 0.96 | 54 | 49.926 |
| 52.4 | 0.95 | 55 | 49.887 |

This is also true for AC signal sources (e.g., an audio signal source). In AC circuits, there are two types of impedance matching: reflectionless matching and maximum power transfer matching. The circuit of the inventive subject matter represents an effort to achieve reflectionless impedance matching between an audio signal source and an array of speakers. For purposes of explanation of the concept, the audio signal source is referred to as having a source impedance and the array of speakers is referred to as having a load impedance. It should be recognized that perfectly reflectionless matching may be unattainable for audio signal sources and speaker arrays that have different impedances, but the inventive subject matter is drawn toward a novel new system of minimizing, or at least substantially reducing, signal reflection.

Impedance is different from resistance in that impedance takes into account reactance as well as resistance. In a broad sense, impedance is a measure of opposition that a circuit presents to a current when a voltage is applied. More specifically, impedance has a resistance value and a reactance value. It is expressed as, $$Z=R+jX$$

where Z is impedance, R is resistance, X is reactance, and j is the imaginary unit. Simply put, impedance can be any combination of resistors, capacitors, and inductors, where the real component of impedance is resistance and the imaginary component is reactance (e.g., capacitor and/or inductor reactance). Finally, impedance can similarly be applied to Ohm's law as, $$V=IZ$$

thus extending Ohm's law to AC circuits.

Because of the similarities between DC circuits and AC circuits, impedance matching can be accomplished in AC circuits in a manner similar to resistance matching in DC circuits. As mentioned above, there are two types of impedance matching that can be accomplished in AC circuits. This results from the fact that impedance in AC circuits has a complex reactance component as well as a resistive component. The first type of impedance matching results in maximum power transfer and is achieved by matching a source impedance with the complex conjugate of a load impedance. This is expressed as, $$Z_S=Z_L^*$$

where $Z_S$ is a source impedance and $Z_L$ is a load impedance, the asterisk represents the complex conjugate of the variable $Z_L^*$.

The second type of impedance matching results in minimized signal reflection from the load, $Z_L$. To minimize signal reflection source impedance and load impedance must be equal. This is expressed as, $$Z_S=Z_L$$

where $Z_S$ is a source impedance and $Z_L$ is a load impedance.

In the inventive subject matter, the goal is to minimize signal reflection between a load (e.g., an array of speakers) and a source (e.g., an audio signal source). In the case of an audio signal source and an array of speakers, both source and load impedances are functions of frequency. Frequency dependence of reactance makes impedance matching difficult when frequency constantly varies as with an audio signal (e.g., music and/or audio books). The impedance of a source and a load may not vary by the same amount across all frequencies resulting in a mismatch leading to signal reflection.

Embodiments of the inventive subject matter solve this problem by providing a circuit comprising at least one inductor between the signal source and the load. When an inductor having an appropriate inductance is placed between an audio signal source and an array of speakers, it will naturally provide some degree of impedance matching. An inductor can be placed in different locations of the circuit (e.g., on the positive side that couples the positive terminal of an audio signal source to the positive terminal of an array of speakers and/or on the negative side that couples the negative terminal of an array of speakers to the negative terminal of an audio signal source) to provide optimal impedance matching for different speaker set ups and/or different ranges of audio signals.

The circuit additionally reduces quantization error instantiated during analog-to-digital conversion of an audio signal into a digital format. Quantization distortion is also known as quantization error, and it represents a difference between an actual analog value and a corresponding quantized digital value. Such errors are caused by rounding or truncation of an audio signal when it is encoded into a digital format.

Quantization errors are often manifested during signal reconstruction from a digital format: the signal is rebuilt into as many segments as were originally sampled, resulting in digital "jumps" in signal amplitude along sloped portions. Since these jumps represent sharp rises or falls in a signal, the frequency associated with a jump is typically very high (e.g., greater than 20 kHz).

Circuits of the inventive subject matter accomplish this by virtue of the reactance of inductors. Inductor reactance is expressed as, $$X_L=\omega L$$

where ω is frequency in radians and L is inductance. Therefore, as ω approaches infinity, the reactance of the inductor similarly approaches infinity. Based on the inductance of the particular inductor used in some embodiments of the circuit, reactance can approach infinity at different rates. Thus, very high frequency signals will be excluded by the inductors to some degree.

A simple analogy to mechanical systems provides an excellent example for easy understanding. Inductors can be viewed as operating as a mass does in a mechanical system. So for example, in a rotational system, flywheels are used to prevent sudden changes in rotational velocity. The same is true of inductors in an electrical system—inductors can be viewed as acting as flywheels to prevent sudden changes in current. Depending on the mass of the flywheel (i.e., inductance), sensitivity to change can be tuned to a desired level.

The result of passing an audio signal through the circuit is that quantization errors in the audio signal will be reduced according to the selected inductance for each inductor in the circuit (e.g., 10 µH, 15 µH, 20 µH, 25 µH, 30 µH, 45 µH, 50 µH, 10-15 µH, 15-20 µH, 20-25 µH, 25-30 µH, 30-35, µH, 35-40 µH, 40-45 µH, 45-50 µH, 50-100 µH, 100-200 µH, 500 µH, 1-10 mH, 10-50 mH, 50-100 mH, 100-250 mH, 250-400 mH 400-500 mH). Ultimately, the circuit is configured to not only match the impedances of an audio signal source and an array of speakers, it is also configured to modify an audio signal so that the signal better imitates the original analog waveform.

FIG. 1 depicts an example circuit 100 disposed to couple an audio source (not shown) and an array of speakers 114 and reduces signal reflection by improving impedance matching. The circuit 100 comprises an inductor 110, a resistor 112, and a capacitor 116. The circuit 100 has four terminals 102, 104, 106, and 108, coupled to a positive terminal of an audio signal source, a negative terminal of an audio signal source, a positive terminal of an array of speakers, and a negative terminal of an array of speakers, respectively. The audio signal source coupled to terminal 102, generates an audio signal that can fluctuate in frequency (e.g., primarily frequencies between 20 Hz and 20 kHz for sounds detectible by most humans, but could also include frequencies between 20 kHz-100 kHz and/or 100 kHz-200 kHz caused by noise in the signal). The audio signal generated by the audio signal source enters the circuit 100 via terminal 102, passes to the array of speakers 114 via terminal 106, passes to the circuit 100 from the array of speakers 114 via terminal 108, and finally passes back to the audio signal source (or to some other component, like ground) via terminal 104. In this particular configuration, the inductor 110 is located on the positive side of the circuit 100 that connects directly to the positive terminals 102 and 106. As used herein with respect to circuits, the term "directly" means there is no intervening electrical component.

The inductor 110 is generally configured to match the impedances of the audio signal source and the array of speakers 114. In this embodiment, the audio signal source and the array of speakers 114 can each have different Thevenin equivalent impedances, and the circuit 100 provides a balancing effect between the two to create an impedance match. As mentioned above, the frequency of an audio signal can fluctuate, which affects the impedances of both the audio signal source and the array of speakers 114. As such, the circuit 100 substantially compensates for changes in frequency to maintain impedance matching between the audio signal source and the array of speakers. For example, if the audio signal source has an impedance of 6 Ohms at some frequency, and the array of speakers 114 has an impedance of 8 Ohms at that frequency, then the circuit will provide approximately 2 Ohms of impedance at that frequency. The result is that the audio signal source impedance combined with the inductor impedance is approximately 8 Ohms, which matches the impedance of the array of speakers 114.

Similarly, if the audio signal source has a Thevenin equivalent impedance of 8 Ohms at some frequency and the array of speakers 114 has a Thevenin equivalent impedance of 6 Ohms at that frequency, the circuit will again provide 2 Ohms of impedance at that frequency. This helps to balance the two because when looking from the audio signal source toward the array of speakers, the equivalent impedance of the audio signal source with the circuit 100 is 8 Ohms, thus eliminating, or substantially reducing, reflection of the audio signal from the array of speakers back towards terminal 102.

Since the frequency of the audio signal tends to vary over time, the impedance selected for inductor 110 is generally determined about an average frequency over the span of a selection of music, or a preferred frequency, such as a sustained note. Where inductor 110 is a variable inductor, a control unit (not shown) could be included that allows a user to select the inductance of inductor 110. In some embodiments where the inductance of the audio source and the array of speakers 114 is known, a control unit (not shown) of inductor 110 could allow a user to select a frequency, and inductor 110 will adjust to that frequency. For example, the control unit could be configured to impedance match the best at 1 kHz, at 5 kHz, and at 10 kHz, where a user simply selects the preferred frequency of the circuit. Where inductor 110 is a variable inductor, a user could vary the inductance of inductor 110 until the circuit matches the impedance of the input audio source and speaker array 114 about the preferred frequency, or preferred frequencies where the user wishes to have one preferred frequency for one song, and another preferred frequency for a second song.

The circuit 100 also includes a resistor 112 and a capacitor 116 that are in series with each other while in parallel with the array of speakers 114. The resistor 112 and capacitor 116 act as a high-pass filter preventing high frequency signals above a certain frequency from reaching the array of speakers 114. This is caused by the nature of the impedance of a capacitor, described as, $$X_C = \frac{1}{\omega C}$$

where $X_C$ is the impedance of a capacitor, $\omega$ is the frequency of the signal, and C is capacitance. As frequency approaches infinity, the impedance of a capacitor approaches 0. The effect of this is that a signal having a very high frequency will tend to pass through resistor 112 and capacitor 116 instead of through the array of speakers 114, since current tends to travel through the path of least resistance (or impedance). By placing a resistor 112 and a capacitor 116 in series with each other, a "drop-off" in signal occurs above some frequency. Changing the resistance and capacitance will change both the slope of the ramp portion of the drop-off and the frequency above which the drop-off occurs.

Resistance in embodiments of the circuit 100 can be varied in a number of different ways. In one way, a resistor can be incorporated into the circuit 100 such that it is simply plugged in, and when a different resistance is desired, a different resistor can be plugged in. Another way to vary resistance is to incorporate a potentiometer into the circuit. Potentiometers are typically manually operated, although electronically operated variable resistors are also contemplated. Capacitor control can be achieved similarly. For example: capacitors having difference capacitances can be plugged into the circuit depending on the desired traits of the circuit; variation in capacitance can be achieved mechanically via manual manipulation (e.g., operating a screw); or capacitance can be modified electronically using, for example, a computer or a microcontroller. Similar to the exemplary control unit above, another control unit could be included that allows a user to select the resistance of resistor 112 and capacitance of capacitor 116, or the drop-off frequency itself.

Figure 2:
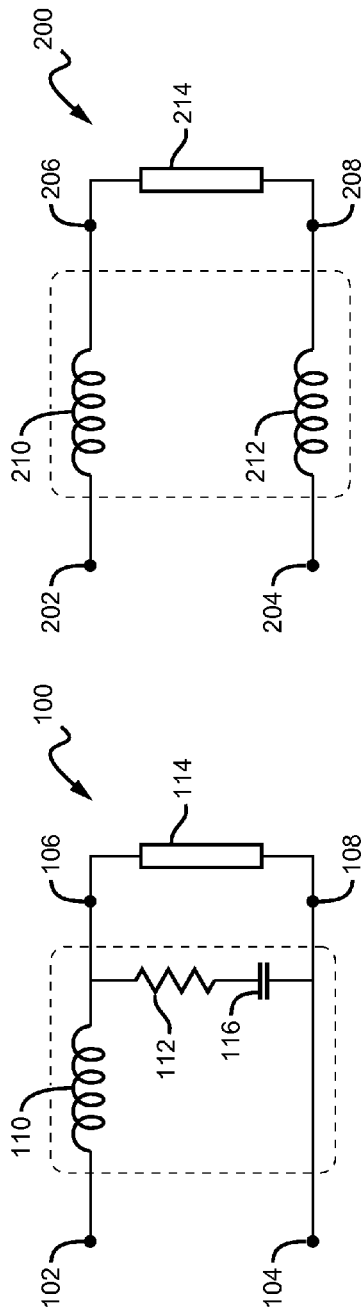
FIG. 2 shows a circuit for improving efficiency of an array of speakers that includes two inductors.

FIG. 2 depicts another exemplary circuit 200 for matching impedance between an audio source and an array of speakers 214. Instead of having just one inductor as shown in the circuit 100 of FIG. 1, the circuit 200 includes two inductors 210 and 212. As shown, the two inductors 210 and 212 are located on different sides of the circuit 200. Specifically, a first inductor 210 is located on the positive side of the circuit 200 and is coupled to the positive terminal 202 of the audio signal source and the positive terminal 206 of the array of speakers. A second inductor 212 is located on the negative side of the circuit 200 and is coupled to negative terminal of the audio signal source and the negative terminal of the array of speakers. FIG. 2 also shows that the resistor and capacitor of FIG. 1 can be optional to the circuit.

Providing a second inductor 212 on the other side of the circuit 200 (i.e., between the negative terminal of the array of speakers 208 and the negative terminal of the audio signal source 204) further helps to match impedance. An audio signal is typically an AC sinusoidal signal and thus fluctuates about a 0 value (i.e., 0 volts). Thus, the audio signal drives current in both directions through the circuit 200, which causes the diaphragm(s) of the speaker(s) in the array of speakers to be actively pulled in different directions by the voice coil(s) to create sound waves. Because current travels in both directions through the circuit and the array of speakers, it can be advantageous for the circuit to be symmetrical. This symmetry results in the ability of the circuit to compensate for the electromagnetic effects caused by movement of the permanent magnet in the speaker driver(s) relative to the voice coil of the driver(s). Having inductors on both sides allows the circuit 200 to absorb current created by such movement and allow the speaker diaphragm(s) in the array of speakers 214 to more freely resonate without experiencing as much mechanical reluctance caused by the electromagnetic effect of the permanent magnet(s) moving relative to the voice coil(s).

Figure 3:
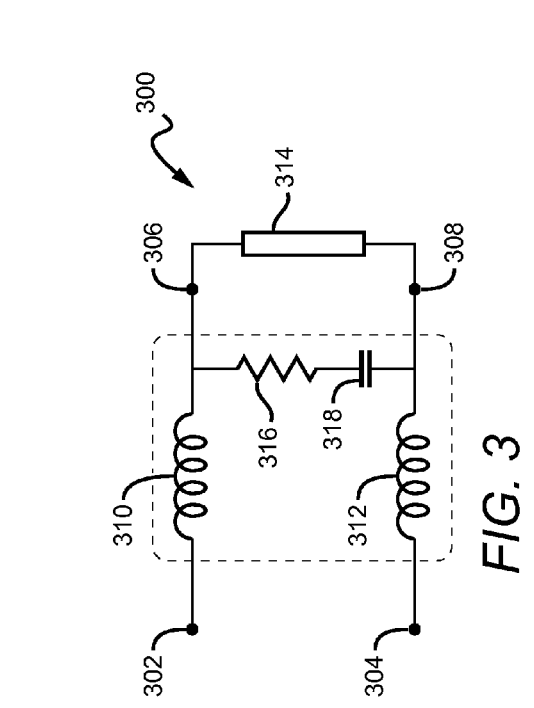
FIG. 3 shows a circuit for improving efficiency of an array of speakers that includes two inductors, a resistor, and a capacitor.

FIG. 3 is a circuit diagram of an embodiment of the circuit 300 having two inductors 310 and 312, a resistor 316, and a capacitor 318. As discussed in relation to FIG. 1, the resistor 316 and capacitor 318 act as a low-pass filter, and, as discussed above, the inductors 310, 312 help to achieve substantially reflectionless impedance matching between the audio signal source (e.g., an amplifier) and the array of speakers 314. An audio signal enters the circuit through terminal 302, passes through inductor 310, and is affected by the filtering properties of the resistor 316 and the capacitor 318 before leaving the circuit via terminal 306. Terminal 306 is coupled to the positive terminal of the array of speakers 314, which the signal passes through before returning to the circuit via terminal 308. From there, it passes back through terminal 304 to the audio signal source.

The embodiment of FIG. 3 brings together two key advantageous aspects (both described in more detail above): (1) the advantages of a circuit 300 having an inductor 310 between the positive terminals of the audio signal source and the array of speakers, as well as an inductor 312 between the negative terminals of the same, and (2) the advantages of having a resistor 316 and capacitor 318 across the positive and negative terminals of the array of speakers 314.

Having the resistor 316 and the capacitor 318 coupled to the positive and negative terminals allows the signal or a portion of the signal to pass back to the audio signal source without first travelling through the array of speakers 314, as discussed above. In this embodiment, any signal, or portion of a signal, circumventing the array of speakers 314 will nevertheless encounter this inductor 312.

When signal passes through the resistor 316 and the capacitor 318, and subsequently encounters inductor 312, the signal that passed through the speakers is phase shifted relative to the signal that has passed through the resistor 316 and the capacitor 318. Signal that has passed through the resistor and the capacitor encounters signal that has passed through the array of speakers and cancels out the phase shift brought on by the array of speakers, thus allowing the inductor 312 to operate more effectively and in sync with the other inductor 310. One advantageous result of this, as discussed above, is that the speakers are able to more freely mechanically resonate since the inductors are able to absorb electromagnetically induced current.

Figure 4:
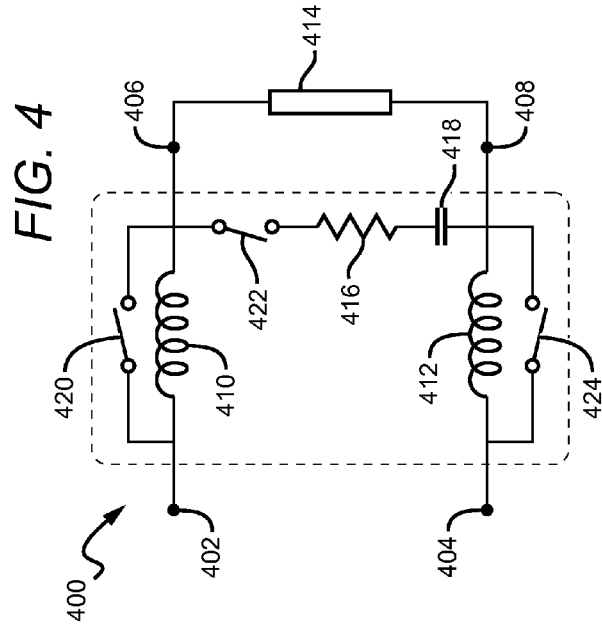
FIG. 4 shows a circuit for improving efficiency of an array of speakers that includes two inductors, a resistor, a capacitor, and three switches.

FIG. 4 is a circuit diagram of another embodiment of the circuit 400. It is similar to the circuit 300 of FIG. 3, except that it includes switches 420, 422, and 424. When the switches 420, 422, and 424 are closed, the circuit 400 operates identically as the circuit 300 of FIG. 3. An audio signal enters the circuit 400 through terminal 402, passes through inductor 410, and is affected by the filtering properties of the resister 416 and the capacitor 418 before leaving the circuit via terminal 406. Terminal 406 is coupled to the positive terminal of the array of speakers 414, through which the signal passes before returning to the circuit via terminal 408. From there, it passes back through terminal 404 to the audio signal source. The switches 420, 422, 424 can be closed to essentially take the corresponding circuit component out of the circuit. For example: if switch 420 is closed, then inductor 410 is shorted out of the circuit; if switch 422 is closed, then resistor 416 and capacitor 418 are removed from the circuit; and if switch 424 is closed, then inductor 412 is shorted out of the circuit.

Operating switches 420, 422, and 424 in a coordinated fashion can produce desirable results, such as phase shifting of an audio signal. The switches 420, 422, and 424 can be mechanical relays, electronic switches such as, for example, transistors, or any other switches known in the art. Switches 420, 422, and 424 can additionally be operated either mechanically or electronically. Mechanical operation involves mechanically changing the state of a switch, while electronic operation involves changing the state of a switch using electricity (e.g., a transistor).

A phase shift in this context can refer to any change in phase of a signal, or in the phase difference between two or more signals. In the embodiment of FIG. 4, the desired phase shift involves shifting an audio signal in the time domain. In other words, the signal is delayed by some fraction of time, causing the wave form to lag in time behind where it might otherwise be. This effect is desirable for the same reason as described above with regard to canceling phase shifting. By providing an avenue to control phase shifting, the negative effects of phase shifting caused by the array of speakers 414 can be minimized. Thus, phase shifting can be used to advantageously to enable the speaker(s) of the array of speakers 414 to resonate more freely, which allows the array of speakers to perform better across a broader range of frequencies than it otherwise would without the circuit 400.

Figure 5:
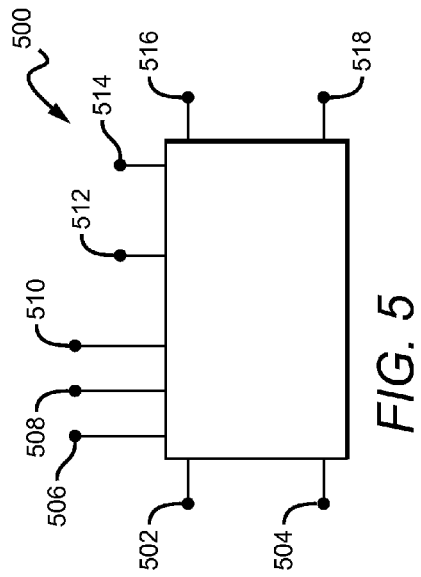
FIG. 5 is an abstract depiction of a box that can contain a circuit for improving the efficiency of an array of speakers.

FIG. 5 shows an embodiment of the inventive subject matter as a black box 500. The black box 500 can contain any embodiment of the circuits including those described above. The black box 500 has four terminals 502, 504, 516, and 518 that are used to transmit an audio signal. Terminal 502 is coupled to the positive terminal of an audio signal source, and terminal 516 is coupled to a positive terminal of a speaker or array of speakers. Terminal 518 is coupled to a negative terminal of a speaker or array of speakers. Finally, terminal 504 is coupled to the negative terminal of an audio signal source. In alternative embodiments, terminal 502 and 504 could be incorporated into a single input port and terminal 516 and 518 could be incorporated into a single output port without departing from the scope of the current invention.

In some embodiments, the positive terminal of an audio signal source transmits a signal to a speaker, while the negative terminal completes a circuit with the speaker and the audio signal source. In most home theater systems, for example, the audio signal source is an amplifier. Other examples of signal sources include CD players, digital music players (e.g., cell phones, tablets, iPod touches and similar devices, etc.). It is foreseeable that the device of some embodiments can be used with any music signal from any source, even if the source does not provide a digitally reconstructed signal (e.g., a vinyl record player). Any speaker associated with an embodiment of the system has a positive and negative terminal corresponding to the positive and negative terminals of the audio signal source. The black box 500 is a unit designed to sit between the audio signal source and the array of speakers, thus it has four terminals 502, 504, 516, and 518.

The black box 500 can additionally have a number of inputs 506, 508, 510, 512, and 514. Inputs 506, 508, and 510 provide for control of switches that can optionally be included in the circuit contained within the black box. First switch control 506 provides for control of a first switch, for example switch 420, second switch control 508 provides for control of a second switch, for example switch 422, and third switch control 510 provides for control of a third switch, for example switch 424. Additional switches could be incorporated without departing from the scope of the current invention. Switching inputs are optional, however, and depend on the configuration of the circuit within the black box 500. Inputs 512 and 514 provide for control of a resistor and capacitor, respectively. Resistor control 512 allows for variation of a resistor in a circuit contained with the black box 500, while capacitor control 514 allows for variation of the capacitance of a capacitor. This feature is optional, and inclusion in the device depends on whether a variable resistor and/or capacitor has been used in the circuit.

The switches could be manual switches controlled by moving a switch or a bar across an interface, or could be electronic switches that are controlled by a centralized control interface (not shown). In embodiments where the switches are manual switches, indicators are preferably placed near the switches to indicate how the properties of the circuit are changed. For example in one embodiment first switch control 506 could have an indicator showing that it controls inductor 1, which could be turned ON for impedance matching or OFF to deactivate impedance matching, and/or could even have indicators that show that a first position sets inductor 1 to a first inductance of 25 µH, a second position that sets inductor 1 to a second inductance of 50 µH, and a third position that sets inductor 1 to a third inductance of 100 µH. Similar indicators could be provided to adjust the resistance and/or capacitance of an RC circuit, and/or another inductor included in black box 500. Where the switches are electronic inputs, a separate user interface (not shown) would preferably have such indicators.

Figure 6A:
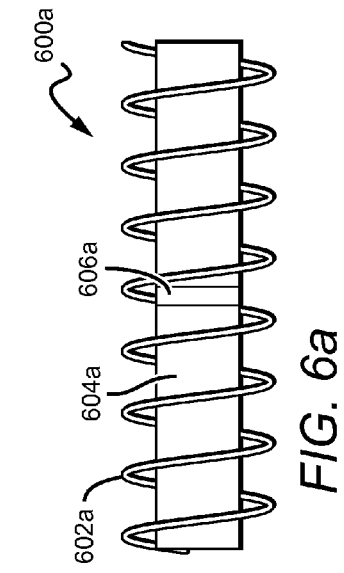
FIGS. 6a and 6b illustrate possible configurations for a specialized inductor that can be used in the circuit.
Figure 6B:
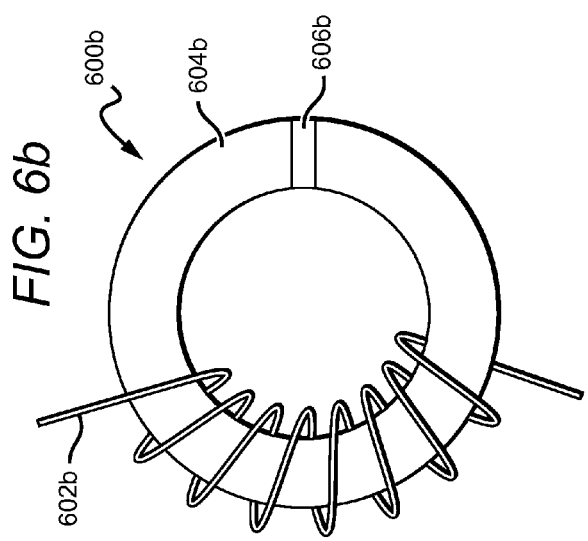

FIGS. 6a and 6b show exemplary inductors 600a, 600b that can be used with any of the embodiments from FIGS. 1-5 to produce better impedance matching over a range of frequencies. Inductors have three main components: (1) a coiled wire 602a, 602b; (2) a core 604a, 604b; and (3) a sometimes one or more gaps 606a, 606b. When current passes through the coiled wire 602a, 602b, a magnetic field is generated within the core 604a, 604b and gap 606a, 606b. Depending on the material within the core 604a, 604b and the gap 606a, 606b, the magnetic field can have different effects.

Providing a component having an impedance between two other components having two different resulting impedances normally results in an impedance match only in the vicinity of a specific signal frequency. This results because impedance is a function of frequency, and thus as frequency changes, impedances change at different rates. Embodiments of the inventive subject matter solve this problem by using inductors whose impedances vary at a rate that is proportional to the rate of change of both the impedance of the audio signal source and the impedance of the array of speakers. In this way, the impedances remain matched across a wide range of signal frequencies.

In essence, the ability of the inductor to vary at a desired rate makes matching across a range of frequencies possible. For example, if the audio signal source has an impedance of 2 Ohms at 100 Hz and the array of speakers has an impedance of 8 Ohms at 100 Hz, then the inductor will have approximately 6 Ohms impedance at 100 Hz to create an impedance match. If those same components have impedances of 6 Ohms and 24 Ohms at 10 kHz, respectively, then the inductor will ideally have an impedance of approximately 18 Ohms at 10 kHz to create an impedance match.

Inductance can be described generally as, $$L = \frac{\mu N^2 A}{l}$$

where µ is the permeability of the core, N is the number of times the wire has been wound around the core, A is the cross-sectional area of the core, l is the length of the core, and L is inductance. Thus, altering permeability of the core affects inductance and thus the response characteristics of an inductor. Core material can also affect the resonant characteristics of an inductor, because a core material has a characteristic frequency at which the inductor exhibits the highest inductance. As a result, one or more core materials can be selected such that the inductor's performance peaks at particular frequency or across a range of frequencies.

The concept of selecting a core material to provide peak performance at a particular frequency can be expanded by creating an inductor using multiple materials having multiple characteristic frequencies. For example, a part of the core can be made from one material having a permeability and characteristic frequency, while the rest of the core can be made from another material having a different permeability and characteristic frequency. Such a combination results in the inductor having two different performance peaks at two different frequencies. For applications such as audio signals, the overall effect is that such inductors are able to perform better over a broader range of audio signal frequencies. For example, an inductor can one or more core materials (e.g., blended or having boundary layers) where the material or materials all have different material properties (e.g., different permeabilities).

By carefully selecting core materials based on desired permeability and material properties, an inductor can be created that exhibits advantageous characteristics across a broader range of frequencies than a standard inductors having only a single core material.

The same concept can be applied the gap portion of the inductor. It can be made up of one or more materials selected based on desired permeability and desired effects across a range of frequencies.

The materials used in the core and gap can be some combination of paramagnetic, ferromagnetic, and/or diamagnetic materials. Some paramagnetic materials include (written in the form of, "material (approximate relative permeability)"): air (1.0000004), aluminum (1.00002), and palladium (1.0008). Some ferromagnetic materials include: 2-81 Permalloy powder (130), cobalt (250), nickel (600), ferroxcube 3 (1,500), mild steel (2,000), iron (5,000), silicon iron (7,000), 78 Permalloy (100,000), mumetal (100,000), purified iron (200,000), and superalloy (1,000,000). Some diamagnetic materials include: bismuth (0.99983), silver (0.99993), lead (0.99993), copper (0.999991), and water (0.999991).

The inductor can be made in many configurations based on the frequency requirements. For example, the frequency range that the inductor is to be used with is an important factor to consider when determining the size of the gap portion of the inductor. The gap and/or can include, for example, Ti02-6 (e.g., 30-35%, 35-40%, 40-45%, 45-50%, 50-55%, 55-60%, 60-65%, 65-70%, 70-75%, 75-80%, 80-85%, 85-90%, or 90-98% by volume), aluminum (e.g., 5-10%, 10-15%, 15-20%, 20-25%, 25-30% by volume), Cobalt (e.g., 2-5%, 5-10%, 10-15%, 15-20%, 20-25%, 25-30% by volume), and sometimes tin binders (0.5-2%, 2-4%, 4-6%, 6-8%, 8-10%). The proportions for each material used in the core and/or gap are determined based on a frequency range to be used with the inductor. In addition to the specific materials listed above, it is contemplated that these ranges can similarly apply to any paramagnetic, diamagnetic, or ferromagnetic material that is used to create the inductor.

Any combination of materials is contemplated to alter the properties of inductor 600a or inductor 600b. For example, 604a could comprise a paramagnetic material comprising at least 60% by volume while gap 606a could comprise a ferromagnetic material comprising at least 30% by volume, or 604b could comprise a ferromagnetic material comprising at least 70% by volume while gap 606b could comprise a diamagnetic material comprising at least 25% by volume. A plurality of gaps (not shown) could be used to further vary the properties of the inductor, such as an inductor having a paramagnetic core, a first gap of ferromagnetic material, and a second gap of diamagnetic material. One, two, three, or more such gaps could be embedded in an inductor to alter its properties. In other embodiments, the core itself is partitioned into segments of different materials, such as a first segment of paramagnetic material, a second segment of diamagnetic material, a third segment of ferromagnetic material, and a fourth segment of paramagnetic material.

Figure 7A:
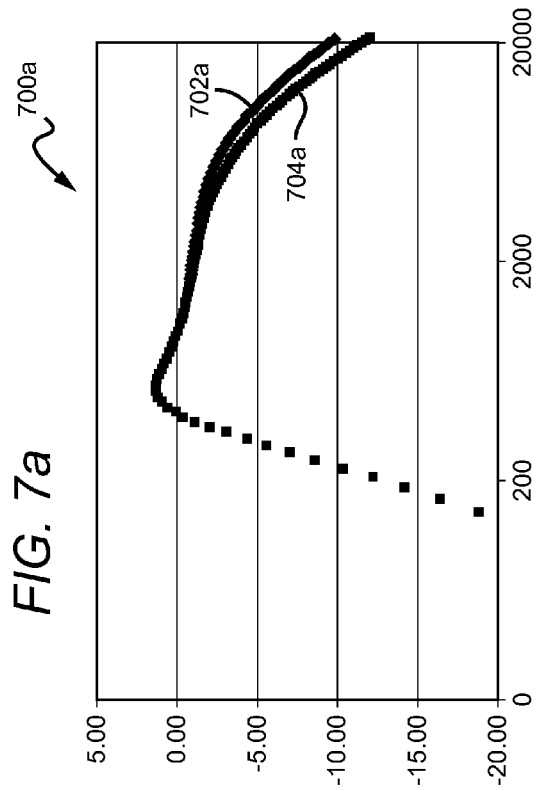
FIGS. 7a and 7b shows both theoretical and actual gain characteristics of an embodiment of the circuit using the specialized inductor of FIG. 6.
Figure 7B:
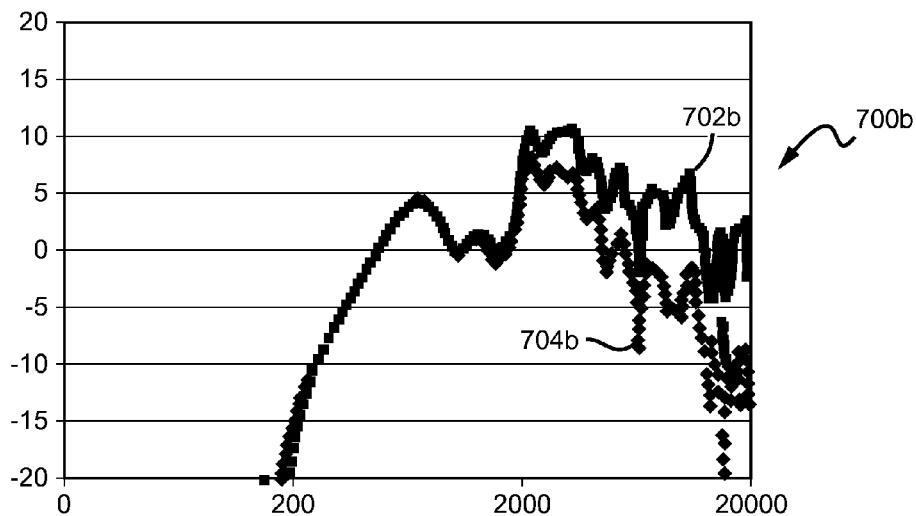

FIGS. 7a and 7b show a number of graphs 700a, 700b depicting gain characteristics of systems using embodiments of the circuit with inductors from FIG. 6. Graph 700a shows simulated gain relative to 1 kHz both with and without an embodiment of the circuit activated to modify the signal. Data set 702a depicts a simulation of gain relative to 1 kHz without an embodiment of the circuit connected between the audio source and the speaker array, and data set 704a depicts a simulation of gain relative to 1 kHz with an embodiment of the circuit connected between to the audio source and the speaker array. The simulated results show that passing a signal through a system using an embodiment of the circuit should result in a drop in gain relative to a system that is not using an embodiment of the circuit beginning around 2 kHz.

Graph 700b depicts actual measured results comparing the gain of a system that does not use an embodiment of the circuit compared to a system that does use an embodiment of the circuit. Data set 702b depicts a simulation of gain relative to 1 kHz without an embodiment of the circuit, and data set 704b depicts a simulation of gain relative to 1 kHz with an embodiment of the circuit connected. The gain fluctuates more in the real-world system than in the simulated system, due in large part to un-modeled nonlinear behaviors in many of the components of the system. However, the real-world results also show that passing a signal through a system using an embodiment of the circuit should result in a drop in gain relative to a system that is not using an embodiment of the circuit beginning around 2 kHz.

Figure 8:
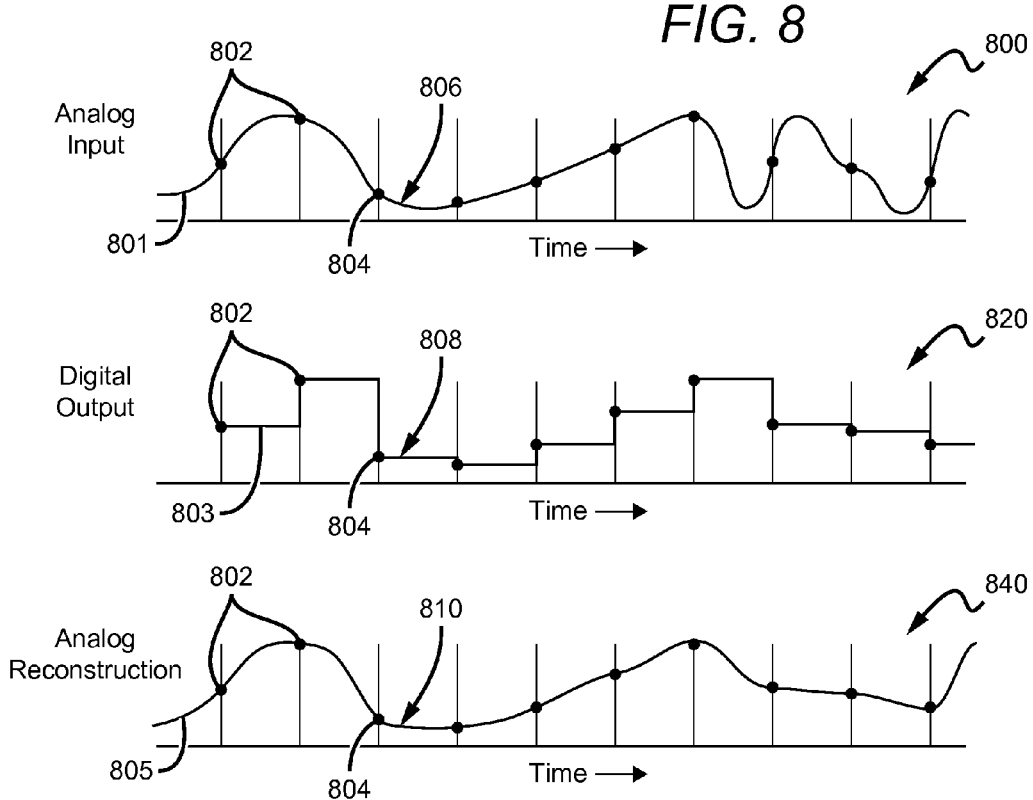
FIG. 8 shows a depiction of an original analog signal, a quantized version, and a reconstructed version of that signal created using the circuit.

FIG. 8 shows a depiction of an example audio signal in three different forms. The first graph 800 shows an original audio signal 801 before it has been converted into a digital format, the second graph 820 shows the audio signal 803 after it has been reconstructed after digitization, and the third graph 840 shows the signal 805 after it has passed through an embodiment of the inventive subject matter. The original audio signal 801 is first divided into different segments of time, which correspond to sample times 802. At each sample time 802, the amplitude of the signal is detected and stored for an entire time segment. For example, when the original audio signal 801 is sampled at time 804, the amplitude of the signal at that time is extended for the duration of that time segment. Thus, segment 806 becomes segment 808 as seen in graph 820. Finally, after passing through an embodiment of the circuit, signal segment 808 appears approximately as signal segment 810 in graph 840, which more closely resembles the analog input than digital output 808.

Figure 9:
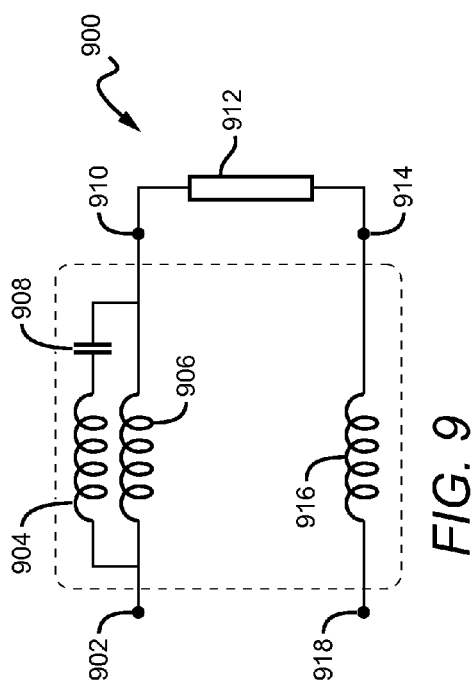
FIG. 9 shows a circuit for improving efficiency of an array of speakers and reducing quantization noise present in an audio signal.

FIG. 9 shows a circuit diagram 900 of a circuit that provides not only improved impedance matching between an audio signal source and an array of speakers 912, but it also reduces quantization noise in an audio signal passing from an audio signal source to an array of speakers 912.

To improve impedance matching, inductors 904 and 906 combined with capacitor 908 are configured to have a resultant impedance that improves impedance matching between and audio signal source and an array of speakers 912. Inductor 904 is placed in series with capacitor 908, which are both in parallel with inductor 906. These components make up circuitry that couples the positive terminal 902 of an audio signal source to the positive terminal of the array of speakers 910. A third inductor 916 couples the negative terminal of the audio signal source 918 to the negative terminal of the array of speakers 914. Desirable properties (e.g., one or more permeabilities and/or inductances) of the first 912, second 914, and third inductors 916 can be achieved by way of designing the inductors as described above in detail. By selecting gap and core materials having desirable material properties, inductor(s) can be produced having one or more desired permeabilities, which in turn causes the inductor(s) to resonate at one frequency or across a range of frequencies.

As with previously described embodiments, impedance matching remains important. To achieve impedance matching, the components of the circuitries (e.g., the inductors 904, 906 and 916 and capacitor 908) can have a wide variety of inductances and capacitances. The required resultant impedances necessary for improved impedance matching are determined by the impedances of the audio signal source and array of speakers 912 that are coupled by the circuit 900. Specifically, inductors 904 and 906 and capacitor 908 can be different from embodiment to embodiment so long as the resultant impedance of the three components is approximately the same as the impedance of inductor 916. However, it is preferable for inductors 904 and 906 to have substantially similar inductances (e.g., to be within 10% of one another).

To create a balanced, impedance matched circuit, the equivalent impedance of inductors 904 and 906 and capacitor 908 should be approximately equal to the impedance of inductor 916. In some embodiments, the inductances of inductors 904, 906, and 916 are all approximately the same, but in other embodiments the inductances of inductors 904, 906, and 916 can be different from each other as long as the resultant impedance of inductors 904 and 906 and capacitor 908 is approximately equal to the impedance of inductor 916.

Matching the impedance of inductor 916 to inductors 904 and 906 and capacitor 908 is important, but those sets of components must also be tuned such that the impedance of the audio signal source is approximately equal to the impedance of the array of speakers. To make such a match easier to achieve, in some embodiments the various components can be variable (e.g., variable capacitors and/or variable inductors such as capacitors and inductors that can be either manually or electronically varied). By making components 904, 906, 908, and/or 916 variable, the circuit can be tuned to provide improved impedance matching. Tuning can be accomplished by either a computer controlled system, or it can be accomplished by hand via, for example, a screwdriver to manipulate the variable component(s).

The circuit 900 is also configured to reduce quantization noise in an audio signal. Audio signals that have been reconstructed from a digital format often include high frequency noise that, if reproduced by a speaker, would be inaudible to a human listener. Removing this type of noise is advantageous in that it allows a speaker to reproduce primarily sounds that are audible to a human listener. To reduce quantization noise, this circuit 900 includes capacitor 908. When an audio signal is passed from the audio signal source via terminal 902 into the circuitry, which includes inductors 904 and 906 as well as capacitor 908, the audio signal is caused to branch into both paths of the circuitry.

In the top path, the audio signal source encounters inductor 904 and capacitor 908, while in the bottom path it encounters only inductor 906. Since inductors resist change in current, when high frequency spikes in the audio signal reach the inductors 904 and 906, the inductors 904 and 906 help to smooth the signal. In the top path, the signal passes through inductor 904 to reach capacitor 908. Capacitor 908 absorbs charge from the audio signal that passed through inductor 904 and then releases charge into the audio signal that passed through inductor 916. Charge absorbed into capacitor 908 is released into the audio signal having experienced a phase shift (e.g., energy from the signal at time x is released back into the signal at time x+Δx, where Δx is on the order of picoseconds, nanoseconds, microseconds, or milliseconds). By releasing energy back into the audio signal, the capacitor 908 helps to eliminate quantization noise. Rereleased charge from the capacitor, in essence, fills in gaps that represent the absence of information caused by digitally encoding an analog audio signal.

Figure 10:
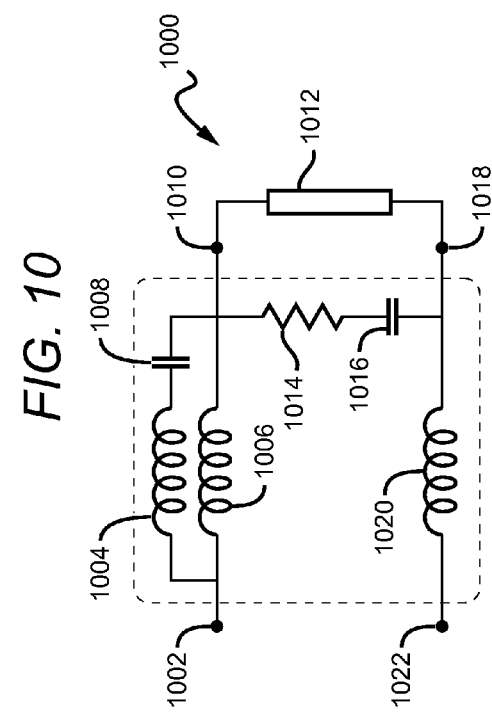
FIG. 10 shows a circuit as in FIG. 9 that also includes a resistor and capacitor to further improve impedance matching.

FIG. 10 shows a circuit 1000 having the components depicted in FIG. 9 and also having a resistor 1014 and capacitor 1016 in parallel with the array of speakers 1012. Similar to the circuit 900 of FIG. 9, the circuit 1000 includes inductors 1004 and 1006, and capacitor 1008 that are configured to have a resultant impedance that improves impedance matching between audio source and an array of speakers 1012. Inductor 1004 is placed in series with capacitor 1008, which are both in parallel with inductor 1006. These components make up circuitry that couples the positive terminal 1002 of an audio signal source to the positive terminal of the array of speakers 1010. A third inductor 1020 couples the negative terminal of the audio signal source 1022 to the negative terminal of the array of speakers 1018. This configuration is similar to that of FIG. 3, which also has a resistor and capacitor in parallel with an array of speakers. When placed in parallel with the array of speakers 1012, the resistor 1014 and capacitor 1016 act as a bypass for high frequency signals. Impedance of capacitors is a function of frequency such that as frequency approaches infinity, the impedance of a capacitor approaches zero. So when a high frequency signal reaches the capacitor 1016 at least a portion of the signal passes through the capacitor 1016 based on the capacitor's 1016 impedance. This effect is desirable because it prevents the array of speakers 1012 from reproducing portions of a signal that are attributable to quantization noise, allowing the array of speakers 1012 to reproduce predominantly sounds in a desired range (e.g., a range of frequencies audible to humans).

Figure 11:
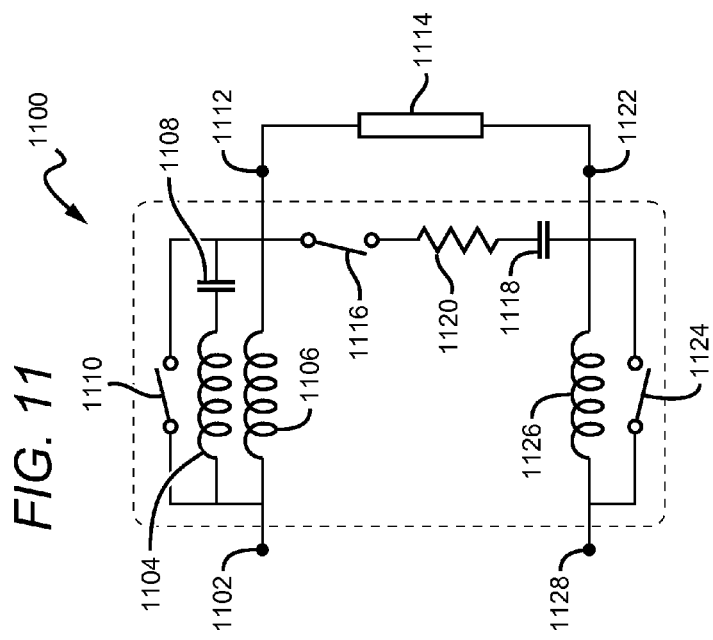
FIG. 11 shows a circuit as in FIG. 10 that also includes switches to allow for phase shifting of an audio signal.

FIG. 11 shows a diagram of a circuit 1100 that is similar to circuit 1000 of FIG. 10. The circuit 1100 has switches 1110, 1116, and 1124 similar to the switches of circuit 400 of FIG. 4, which enable phase shifting of an audio signal passing through the circuit 1100. When the switches 1110 and 1124 are closed, the circuit 1100 operates identically as the circuit 1000 of FIG. 10. Similar to the circuit 1000 of FIG. 10, the circuit 1100 includes inductors 1104 and 1106, and capacitor 1108 that are configured to have a resultant impedance that improves impedance matching between audio source and an array of speakers 1114. Inductor 1104 is placed in series with capacitor 1108, which are both in parallel with inductor 1106. These components make up circuitry that couples the positive terminal 1102 of an audio signal source to the positive terminal of the array of speakers 1112. A third inductor 1026 couples the negative terminal of the audio signal source 128 to the negative terminal of the array of speakers 122. Operating switches 1110, 1116, and 1124 in a coordinated manner can cause a phase shift, and by inducing a phase shift in the audio signal the performance of the array of speakers 1114 can be improved. Introducing the right amount of phase shifting results in speaker(s) of the array of speakers 1114 vibrating in phase with the audio signal—in other words, the speaker(s) of the array of speakers 1114 are enabled to produce better quality sound because the vibration of the speaker(s) in the array of speakers 1114 is better synchronized with the audio signal.

Switches 1110, 1116, and 1124 can be operated either mechanically or electronically. Mechanical operation involves mechanically changing the state of a switch (e.g., a relay), while electronic operation involves changing the state of a switch using electricity (e.g., a transistor). When switches 1110 and 1124 are closed, an audio signal is able to bypass inductors 1104, 1106, 1108, and 1126 so the audio signal can travel directly to the array of speakers. In addition, when switch 1116 is open, no part of an audio signal will reach resistor 1120 or capacitor 1118.

Figure 12:
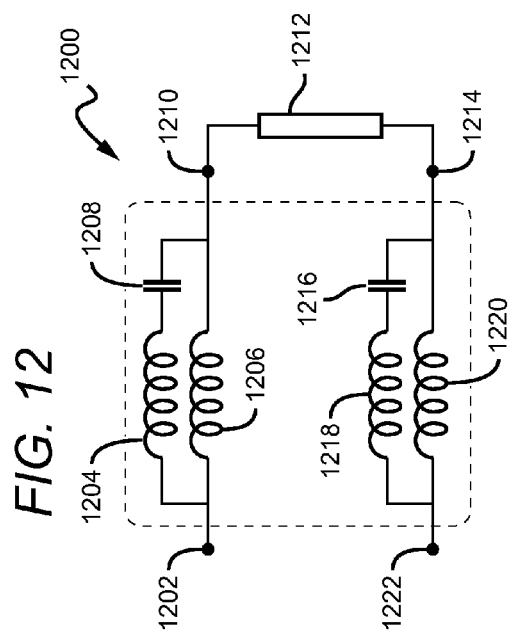
FIG. 12 shows a circuit as in FIG. 9 that has symmetric components between the positive and negative terminals of an array of speakers and an audio signal source.

FIG. 12 shows a diagram of a circuit 1200 that provides improved impedance matching between an audio signal source and an array of speakers 1212, as well as reduced quantization noise in an audio signal passing through the circuit 1200. To do this, the circuitry coupling the positive terminals of the audio signal source 1202 and the array of speakers 1210 has the same components as the circuitry coupling the negative terminals of the audio signal source 1222 and the array of speakers 1214. This circuit 1200 provides the benefits of quantization noise reduction from the circuit of FIG. 9 while maintaining balance in the circuit. By having both circuitries (i.e., the circuitry between the positive terminals including inductors 1204 and 1206 and capacitor 1208 and the circuitry between the negative terminals including inductors 1218 and 1220 and capacitor 1216) include the same component configurations, the overall circuit 1200 is balanced on both the positive and negative sides of the array of speakers. Unlike a circuit where only one circuitry coupling the array of speakers to the audio signal source has two inductors and a capacitor, a circuit where both circuitries have two inductors and a capacitor is balanced not only in that the impedances of each circuitry can be substantially the same, but the behavior of each circuitry when subject to an audio signal is substantially the same as well. This design results in improved impedance matching as well as improved speaker performance in the array of speakers 1212.

Figure 13:
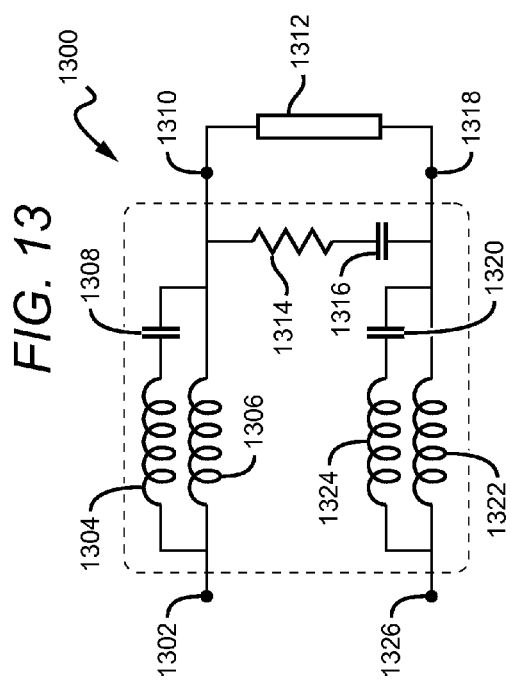
FIG. 13 shows a circuit of FIG. 12 that also has a resistor and capacitor to further improve impedance matching.

FIG. 13 shows a circuit diagram of a circuit 1300 that is substantially similar to the circuit 1200 of FIG. 12, except that it also includes a resistor and a capacitor as the circuit 1000 shown in FIG. 10. This configuration provides all the advantages of the circuit of FIG. 12, with the additional advantages of including a resistor 1314 and a capacitor 1316 as in the circuit of FIG. 10. Similar to the circuit 1200, the circuit 1300 couples the positive terminal of the audio signal source 1302 and the positive terminal of the array of speakers 1310 with inductors 1305 and 1306, and capacitor 1308. The inductor 1304 is in series with the capacitor 1308, which are both parallel with the inductor 1306. The circuit 1300 also couples the negative terminal of the audio source 1326 and the negative terminal of the speakers 1318 with inductors 1322 and 1324, and capacitor 1320. The inductor 1324 is in series with the capacitor 1320, which are both in parallel with the inductor 1322. Resistor 1314 and capacitor 1316, as with the circuit of FIG. 12, provide improved impedance matching by effectively reducing the impedance of the array of speakers 1312 by some degree. The degree of impedance reduction can be tuned by either careful selection of the resistor 1314 and the capacitor 1316, or by implementing a variable resistor, a variable capacitor, or both (e.g., a mechanically or electronically varied resistor and/or capacitor). The resistance and capacitance of the resistor 1314 and capacitor 1316 determine the resultant impedance of those two components, which in turns affects the resultant impedance of the array of speakers 1312 when combined with the resistor 1314 and capacitor 1316.

In addition, the resistor 1314 and capacitor 1316 act as a high pass filter. As described above with regard to the circuit of FIG. 10, as the frequency of an audio signal approaches infinity, capacitance tends toward zero. By selecting a capacitor 1316 having a desirable capacitance, frequencies above a certain range can be allowed to pass (e.g., 20 kHz, 22 kHz, 24 kHz, 26 kHz, 20-22 kHz, 22-24 kHz, or 24-26 kHz), while still forcing frequencies of the audio signal below that range to pass through the array of speakers 1312.

Figure 14:
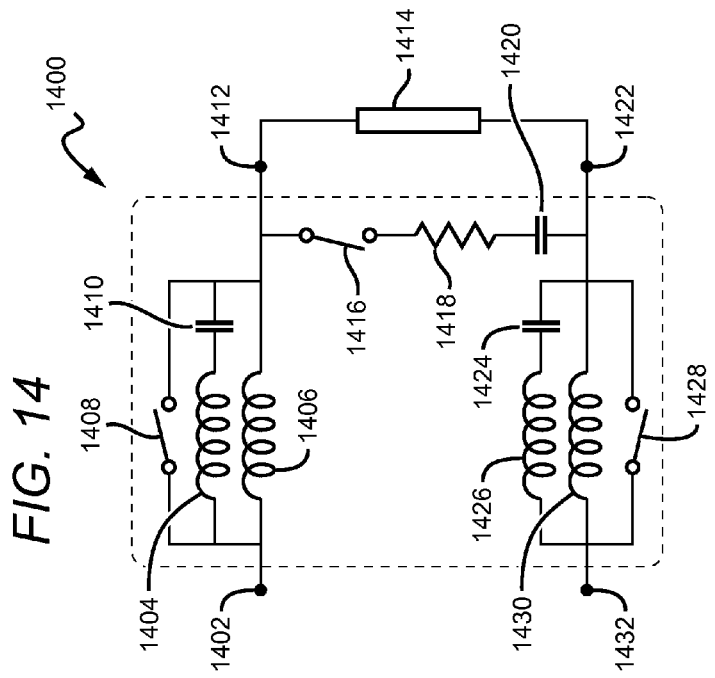
FIG. 14 shows a circuit as in FIG. 13 that also includes switching as in FIG. 11 to allow for phase shifting of an audio signal.

FIG. 14 shows a circuit diagram of a circuit 1400 that is similar to the circuit 1300 of FIG. 13 except that it includes switches 1408, 1416, and 1428 to allow for phase shifting. When the switches 1408 and 1428 is closed, the circuit 1300 operates identically as the circuit 1300. Specifically, the circuit 1400 couples the positive terminal of the audio signal source 1402 and the positive terminal of the array of speakers 1412 with inductors 1404 and 1406, and capacitor 1410. The inductor 1404 is in series with the capacitor 1410, which are both parallel with the inductor 1406. The circuit 1400 also couples the negative terminal of the audio source 1432 and the negative terminal of the speakers 1422 with inductors 1426 and 1430, and capacitor 1424. The inductor 1426 is in series with the capacitor 1424, which are both in parallel with the inductor 1430. Resistor 1418 and capacitor 1420 provide improved impedance matching by effectively reducing the impedance of the array of speakers 1414 by some degree. This embodiment with the switches 1408, 1416, and 1428 has all the advantages of having symmetric circuitries to couple the positive terminal of the array of speakers 1412 to the positive terminal of the audio signal source 1402, and to couple the negative terminal of the array of speakers 1432 to the negative terminal of the audio signal source 1422, as described with regard to FIG. 12. Switching to produce a phase shift is accomplished exactly as described above with respect to FIG. 11.

It should be apparent to those skilled in the art that many modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

What is claimed is:

1. A circuit configured to reduce quantization noise in an audio signal reconstructed from digitally encoded audio, comprising:
    a first circuitry comprising a first inductor in series with a capacitor, both of which are in parallel with a second inductor, wherein the first circuitry is configured to be coupled to a positive terminal of an audio signal source and to a positive terminal of an array of speakers; and
    a second circuitry comprising a third inductor, wherein the second circuitry is configured to be coupled to a negative terminal of the audio signal source and to a negative terminal of the array of speakers,
    wherein the first inductor, the second inductor, the capacitor, and the third inductor are selected such that a Thevenin equivalent impedance of the first circuitry approximately matches the impedance of the second circuitry.

2. The circuit of claim 1, wherein at least one of the first, second, and third inductors comprises a paramagnetic material.

3. The circuit of claim 1, wherein at least one of the first, second, and third inductors comprise a ferromagnetic material.

4. The circuit of claim 1, wherein at least one of the first, second, and third inductors has a gap that comprises at least one of a ferromagnetic and a diamagnetic material.

5. The circuit of claim 1, wherein a first switch is in parallel with the first circuitry.

6. The circuit of claim 1, wherein a second switch is in parallel with the second circuitry.

7. The circuit of claim 1, wherein the Thevenin equivalent impedance of the first circuitry and the impedance of the second circuitry are within 15% of one another.

8. The circuit of claim 1, wherein the capacitor is a variable capacitor.

9. The circuit of claim 8, wherein the variable capacitor is varied mechanically.

10. The circuit of claim 8, wherein the variable capacitor is varied electronically.

11. The circuit of claim 8, wherein at least one of the first inductor, the second inductor, and the third inductor is a variable inductor.

12. The circuit of claim 11, wherein the variable inductor is varied mechanically.

13. The circuit of claim 11, wherein the variable inductor is varied electronically.

\* \* \* \* \*

UNITED STATES PATENT AND TRADEMARK OFFICE
CERTIFICATE OF CORRECTION

| | | |
|---|---|---|
| PATENT NO. | : 9,247,340 B2 | Page 1 of 1 |
| APPLICATION NO. | : 14/503687 | |
| DATED | : January 26, 2016 | |
| INVENTOR(S) | : Wayne J. Powell et al. | |

It is certified that error appears in the above-identified patent and that said Letters Patent is hereby corrected as shown below:

In the claims,

Please replace claim 11, Column 22, lines 63-65 with the claim listed below:

11. The circuit of claim 1, wherein at least one of the first inductor, the second inductor, and the third inductor is a variable inductor.

Signed and Sealed this
Nineteenth Day of April, 2016

Michelle K. Lee
*Director of the United States Patent and Trademark Office*